United States Patent
Hino

(10) Patent No.: US 9,620,690 B2
(45) Date of Patent: Apr. 11, 2017

(54) LIGHTING SYSTEM

(71) Applicant: Toshiba Lighting & Technology Corporation, Yokosuka-shi, Kanagawa-ken (JP)

(72) Inventor: Kiyokazu Hino, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 14/784,123

(22) PCT Filed: Dec. 26, 2013

(86) PCT No.: PCT/JP2013/084942
§ 371 (c)(1),
(2) Date: Oct. 13, 2015

(87) PCT Pub. No.: WO2014/178159
PCT Pub. Date: Nov. 6, 2014

(65) Prior Publication Data
US 2016/0079503 A1    Mar. 17, 2016

(30) Foreign Application Priority Data
Apr. 30, 2013 (JP) .................... 2013-095456

(51) Int. Cl.
*F21V 19/00* (2006.01)
*H01L 33/62* (2010.01)
(Continued)

(52) U.S. Cl.
CPC ............... *H01L 33/62* (2013.01); *F21S 8/10* (2013.01); *F21V 19/005* (2013.01); *F21V 23/02* (2013.01);
(Continued)

(58) Field of Classification Search
CPC ....... H01L 33/62; H01L 33/486; H01L 33/54; H01L 24/49; H01L 25/0753; H01L 33/48;
(Continued)

(56) References Cited

U.S. PATENT DOCUMENTS 8,497,521 B2   7/2013  Ushiyama et al.
2002/0053742 A1*  5/2002  Hata ................... H01L 25/167
257/774
(Continued)

FOREIGN PATENT DOCUMENTS

EP       0854523 A2    7/1998
JP     H10-261821 A    9/1998
(Continued)

OTHER PUBLICATIONS

Feb. 18, 2014—International Search Report—App PCT/JP2013/084942.
(Continued)

*Primary Examiner* — Bryon T Gyllstrom
(74) *Attorney, Agent, or Firm* — Banner & Witcoff, Ltd.

(57) ABSTRACT

Disclosed is a lighting system including: a board; a wiring pattern that is provided on a surface of the board and has a wiring pad; a light emitting element that is provided on the wiring pattern and includes an electrode on a surface thereof opposite to a surface thereof provided on the wiring pattern; a surrounding wall member that is provided to surround the light emitting element; a wiring that connects the wiring pad and the electrode; and a sealing portion that is provided inside the surrounding wall member and covers the light emitting element and the wiring. Here, an angle that is formed by a segment that connects a central position of a portion of the board surrounded by the surrounding wall member and a position where the wiring is connected to the wiring pad, and the wiring is 0° to 45°, or 135° to 180°.

8 Claims, 6 Drawing Sheets

(51) Int. Cl.
| | |
|---|---|
| *H01L 23/00* | (2006.01) |
| *F21V 23/02* | (2006.01) |
| *F21V 23/06* | (2006.01) |
| *H01L 33/48* | (2010.01) |
| *H01L 33/54* | (2010.01) |
| *F21S 8/10* | (2006.01) |
| *H01L 25/075* | (2006.01) |
| *H01L 33/56* | (2010.01) |
| *H01L 33/60* | (2010.01) |
| *H01L 33/64* | (2010.01) |
| *F21V 29/76* | (2015.01) |
| *F21Y 115/10* | (2016.01) |

(52) U.S. Cl.
CPC .............. *F21V 23/06* (2013.01); *H01L 24/49* (2013.01); *H01L 25/0753* (2013.01); *H01L 33/48* (2013.01); *H01L 33/486* (2013.01); *H01L 33/54* (2013.01); *F21V 29/763* (2015.01); *F21Y 2115/10* (2016.08); *H01L 24/45* (2013.01); *H01L 33/56* (2013.01); *H01L 33/60* (2013.01); *H01L 33/641* (2013.01); *H01L 2224/45124* (2013.01); *H01L 2224/45144* (2013.01); *H01L 2224/45147* (2013.01); *H01L 2224/48091* (2013.01); *H01L 2224/48095* (2013.01); *H01L 2224/48247* (2013.01); *H01L 2224/48465* (2013.01); *H01L 2224/49* (2013.01)

(58) Field of Classification Search
CPC .......... F21V 23/02; F21V 23/06; F21V 23/49; F21V 19/005
USPC ........................................................ 362/382
See application file for complete search history.

(56) References Cited

U.S. PATENT DOCUMENTS

| | | | | |
|---|---|---|---|---|
| 2003/0025657 | A1* | 2/2003 | Iwafuchi | H01L 25/167 345/82 |
| 2004/0061433 | A1* | 4/2004 | Izuno | H01L 21/76251 313/498 |
| 2004/0169451 | A1* | 9/2004 | Oishi | H01L 33/64 313/45 |
| 2007/0200223 | A1* | 8/2007 | Konishi | H01L 23/49562 257/706 |
| 2007/0285939 | A1 | 12/2007 | Tachibana | |
| 2009/0020778 | A1* | 1/2009 | Noichi | H01L 25/167 257/99 |
| 2009/0039368 | A1* | 2/2009 | Omae | H01L 33/46 257/98 |
| 2009/0230413 | A1* | 9/2009 | Kobayakawa | H01L 33/483 257/91 |
| 2009/0302340 | A1 | 12/2009 | Ueji et al. | |
| 2010/0027277 | A1* | 2/2010 | Chiang | F21K 9/00 362/382 |
| 2010/0207150 | A1* | 8/2010 | Grajcar | H01L 33/483 257/98 |
| 2011/0186901 | A1 | 8/2011 | Ushiyama et al. | |

FOREIGN PATENT DOCUMENTS

| | | |
|---|---|---|
| JP | 2003-347345 A | 12/2003 |
| JP | 2011-233852 A | 11/2011 |
| JP | 2012-019082 A | 1/2012 |
| JP | 2013-025935 A | 2/2013 |
| JP | 2013-077463 A | 4/2013 |

OTHER PUBLICATIONS

Feb. 18, 2014—(WO) Written Opinion of the ISA—App PCT/JP2013/084942, Eng Tran.

Nov. 30, 2016—(EP) Extended Search Report—App 13883832.1.
Feb. 7, 2017—(JP) Notification of Reasons for Refusal—App 2013-095456, Eng Tran.

* cited by examiner

LIGHTING SYSTEM

TECHNICAL FIELD

Exemplary embodiments hereinafter relate to a lighting system.

BACKGROUND ART

In the related art, there is a lighting system that includes a board, a wiring pattern provided on a surface of the board, plural light emitting diodes (LEDs) provided on the wiring pattern, plural wirings that respectively connect the plural light emitting diodes and the wiring pattern, a surrounding wall member provided on the surface of the board to surround the plural light emitting diodes, and a sealing portion provided inside the surrounding wall member.

In such a lighting system, thermal deformation (expansion and contraction due to temperature change) occurs in the sealing portion when turning on and turning off the light emitting diodes. Further, when the plural light emitting diodes are used to create a high intensity of light, the size and volume of the sealing portion increase, and the influence due to the thermal deformation increases. Further, in an in-vehicle lighting system, as a large change in an ambient temperature is added thereto (for example, a range of −40° C. to +85° C.), the influence due to the thermal deformation further increases.

Further, if the thermal deformation of the sealing portion increases, the wiring that connects the light emitting diodes and the wiring pattern is easily disconnected.

Thus, it is desirable to provide a lighting system capable of enhancing resistance to temperature change.

CITATION LIST

Patent Literature

[PTL 1] JP-A-2013-25935

SUMMARY OF INVENTION

Technical Problem

An object of the invention is to provide a lighting system capable of enhancing resistance to temperature change.

Solution to Problem

According to an aspect of the invention, there is provided a lighting system including: a board; a wiring pattern that is provided on a surface of the board and has a wiring pad; a light emitting element that is provided on the wiring pattern and includes an electrode on a surface thereof opposite to a surface thereof provided on the wiring pattern; a surrounding wall member that is provided to surround the light emitting element; wiring that connects the wiring pad and the electrode; and a sealing portion that is provided inside the surrounding wall member and covers the light emitting element and the wiring. Here, an angle that is formed by a segment that connects a central position of a portion of the board surrounded by the surrounding wall member and a position where the wiring is connected to the wiring pad, and the wiring is 0° to 45°, or 135° to 180°.

Advantageous Effects of Invention

According to the embodiment of the invention, it is possible to provide a lighting system capable of enhancing resistance to temperature change.

DESCRIPTION OF EMBODIMENTS

Figure 1:
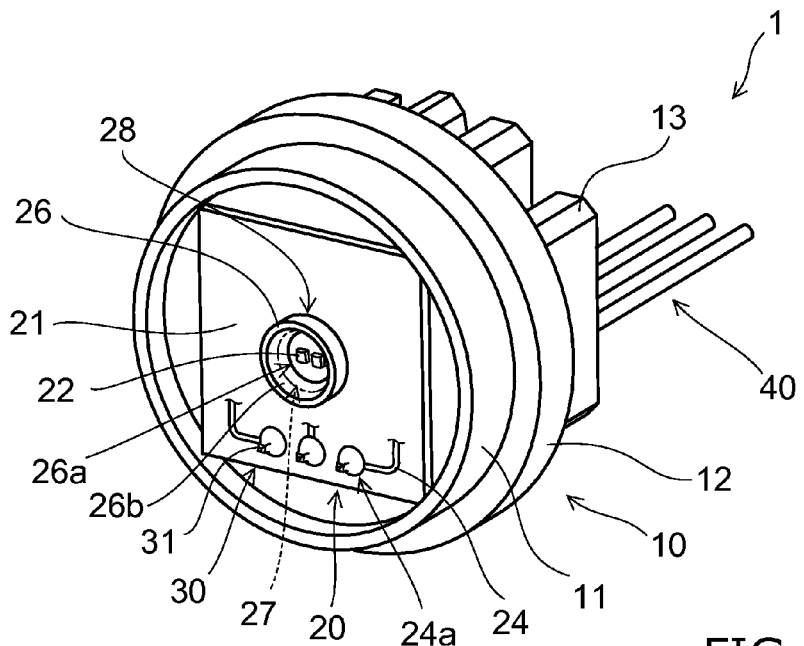
FIG. 1 is a schematic perspective view illustrating a lighting system 1 according to an embodiment of the invention.

According to a first aspect of the invention, a lighting system includes: a board; a wiring pattern that is provided on a surface of the board and has a wiring pad; a light emitting element that is provided on the wiring pattern and includes an electrode on a surface thereof opposite to a surface thereof provided on the wiring pattern; a surrounding wall member that is provided to surround the light emitting element; a wiring that connects the wiring pad and the electrode; and a sealing portion that is provided inside the surrounding wall member and covers the light emitting element and the wiring.

Here, an angle that is formed by a segment that connects a central position of a portion of the board surrounded by the surrounding wall member and a position where the wiring is connected to the wiring pad, and the wiring is 0° to 45°, or 135° to 180°.

According to the lighting system, it is possible to enhance resistance to temperature change.

According to a second aspect of the invention, in the lighting system according to the first aspect of the invention, a linear expansion coefficient of the surrounding wall member is equal to or less than a linear expansion coefficient of the sealing portion.

According to the lighting system, it is possible to enhance resistance to temperature change.

According to a third aspect of the invention, in the lighting system according to the first aspect of the invention, a height from an upper surface of the light emitting element to an upper end of a loop of the wiring is equal to or less than 160 μm.

According to the lighting system, it is possible to enhance resistance to temperature change.

According to a fourth aspect of the invention, the lighting system according to the first aspect of the invention further includes: a power supply terminal that is electrically connected to the wiring pattern; and a socket that is fitted to the power supply terminal.

Hereinafter, embodiments will be described with reference to the accompanying drawings. In the respective drawings, the same reference numerals are given to identical components, and detailed description thereof will be appropriately omitted.

Figure 2:
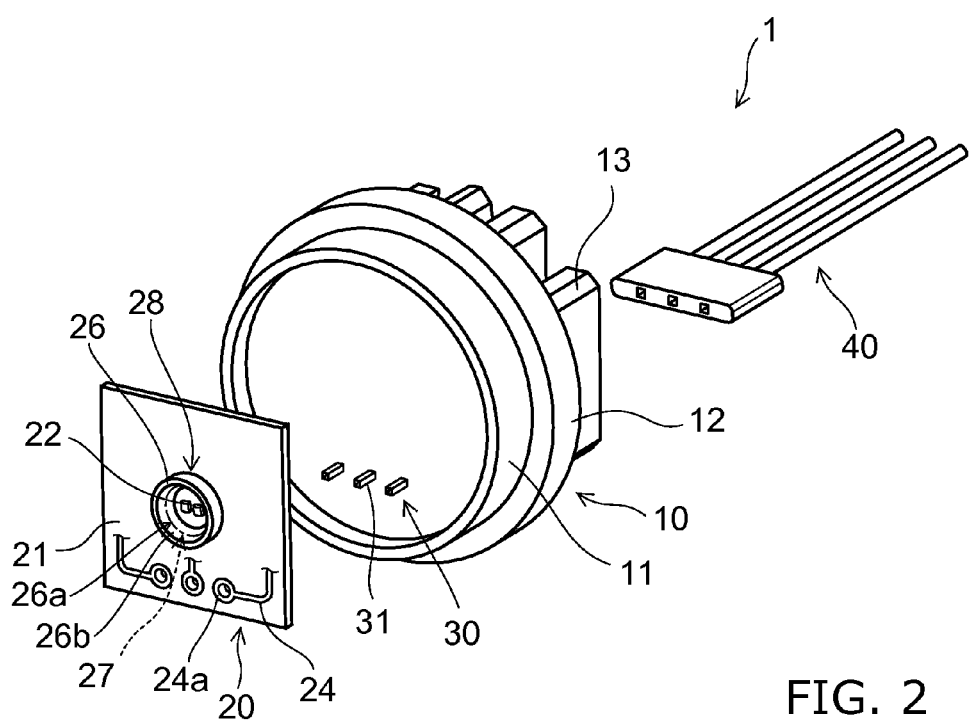
FIG. 2 is a schematic perspective exploded view illustrating the lighting system 1 according to the embodiment of the invention.

FIG. 1 and FIG. 2 are schematic perspective views illustrating a lighting system 1 according to the present embodiment.

FIG. 1 is a schematic perspective view of the lighting system 1, and FIG. 2 is a schematic perspective exploded view of the lighting system 1.

Further, in FIGS. 1 and 2, a sealing portion 27 is not shown for ease of understanding.

Figure 3:
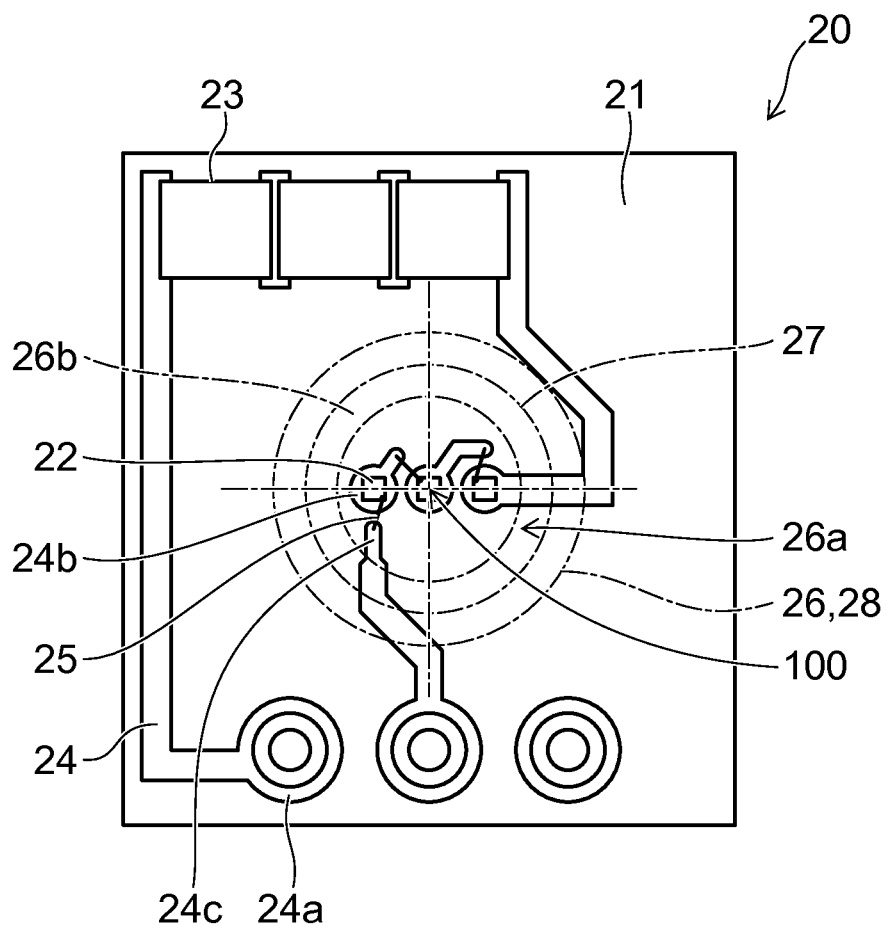
FIG. 3 is a schematic plan view of a light emitting portion 20.

FIG. 3 is a schematic plan view of a light emitting portion 20.

Figure 4:
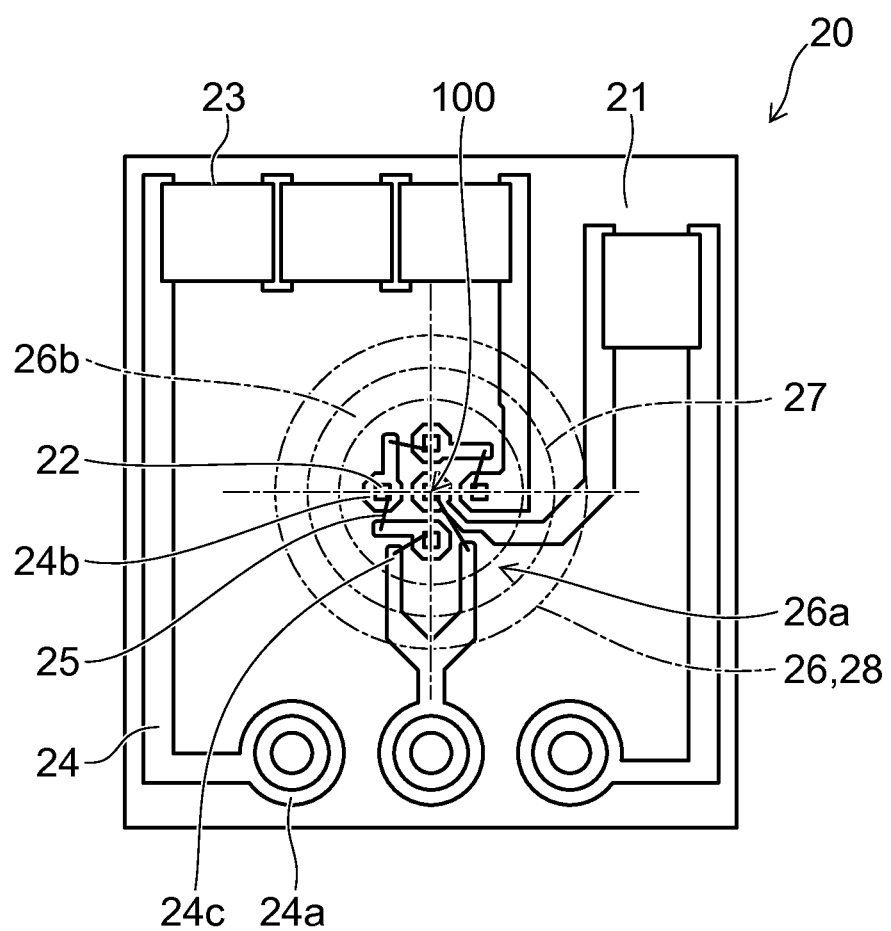
FIG. 4 is a schematic plan view of a light emitting portion 20 according to another embodiment.

FIG. 4 is a schematic plan view of a light emitting portion 20 according to another embodiment.

In FIG. 3 and FIG. 4, the number of light emitting elements 22 and an installation type of a wiring 25 are different.

As shown in FIGS. 1 and 2, the lighting system 1 is provided with a main body portion 10, a light emitting portion 20, a power supply portion 30, and a socket 40.

In the main body portion 10, an accommodating portion 11, a flange 12, and a fin 13 are provided.

The accommodating portion 11 has a cylindrical shape and protrudes from one surface of the flange 12. The light emitting portion 20 is accommodated inside the accommodating portion 11. Further, a power supply terminal 31 of the power supply portion 30 protrudes inside the accommodating portion 11.

The flange 12 has a disk shape, in which the accommodating portion 11 is provided on one surface thereof and the fin 13 is provided on the other surface thereof.

Plural fins 13 protrude from the surface of the flange 12. The plural fins 13 have a plate shape and function as radiating fins.

The main body portion 10 has a function of accommodating the light emitting portion 20, the power supply portion 30, and the like, and a function of discharging heat generated by the light emitting portion 20 and the power supply portion 30 to the outside of the lighting system 1.

Thus, in consideration of the heat discharge to the outside, it is possible to make the main body portion 10 of a material with a high thermal conductivity. For example, the main body portion 10 may be formed of aluminum, an aluminum alloy, a resin with a high thermal conductivity, or the like. The resin with the high thermal conductivity is obtained by mixing a resin such as PET or nylon with fibers or particles made of high thermal conductivity carbon, aluminum oxide, or the like, for example.

In this case, a portion that discharges heat to the outside, such as the fin 13, may be formed of a material with a high thermal conductivity, and the remaining portions may be formed of a resin or the like.

Further, when a main part of the main body portion 10 is formed of a conductive material, in order to secure electric insulation properties between the power supply terminal 31 and the conductive material of the main body portion 10, a configuration in which an outer surface of the power supply terminal 31 is covered with an insulating material (not shown) and a conductive material is disposed thereon may be used. The insulating material is a resin, for example, and preferably, is a material with a high thermal conductivity. Further, a mounting portion capable of being detachably attached to a vehicle lamp tool may be provided in the main body portion 10.

As shown in FIG. 3 or FIG. 4, a board 21, a light emitting element 22, a control element 23, a wiring pattern 24, a wiring 25, a surrounding wall member 26, a sealing portion 27, and a bonding portion 28 are provided in the light emitting portion 20.

The board 21 is provided inside the accommodating portion 11 of the main body portion 10.

The board 21 has a plate shape, in which the wiring pattern 24 is provided on a surface thereof.

A material used or a structure of the board 21 is not particularly limited. For example, the board 21 may be formed of an inorganic material (ceramics) such as aluminum oxide or aluminum nitride, an organic material such as paper phenol or glass epoxy, or the like. Further, the board 21 may have a configuration in which a surface of a metal plate is coated with an insulator. When the surface of the metal plate is coated with the insulator, the insulator may be formed of an organic material, or may be formed of an inorganic material.

In this case, when a heating value of the light emitting element 22 is large, it is preferable to form the board 21 using a material with a high thermal conductivity in terms of heat radiation. As the material with the high thermal conductivity, for example, a material obtained by coating a surface of ceramics such as aluminum oxide or aluminum nitride, a resin with a high thermal conductivity, and a metal plate with an insulator, or the like may be used.

Further, the board 21 may be a single layer board or a multilayer board.

Plural light emitting elements 22 are mounted on the wiring pattern 24 provided on a surface of the board 21.

Figure 8:
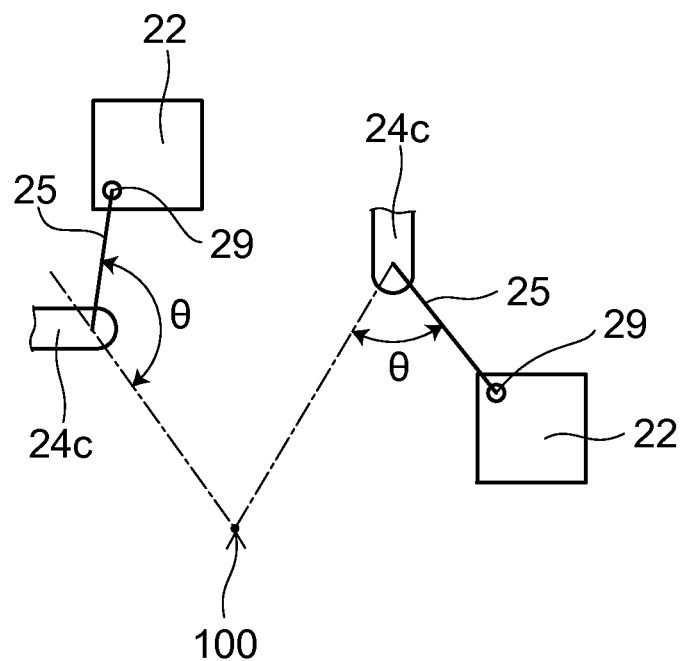
FIG. 8 is a schematic view illustrating an installation angle θ of the wiring 25.

The light emitting element 22 may have an electrode 29 on a surface (upper surface) thereof opposite to a surface thereof provided on the wiring pattern 24 (see FIG. 8). The electrode 29 may be provided on both the surface (lower surface) provided on the wiring pattern 24 and the surface (upper surface) opposite to the surface provided on the wiring pattern 24, or may be provided only on the surface (upper surface) opposite to the surface provided on the wiring pattern 24.

The electrode 29 provided on the lower surface of the light emitting element 22 is electrically connected to a mounting pad 24b that is provided in the wiring pattern 24 through a conductive thermosetting material such as silver paste. The electrode 29 provided on the upper surface of the light emitting element 22 is electrically connected to a wiring pad 24c that is provided in the wiring pattern 24 through the wiring 25.

The light emitting element 22 may be a light emitting diode, an organic light emitting diode, a laser diode, or the like.

An upper surface of the light emitting element 22, which is a light emitting surface, is directed toward a front side of the lighting system 1, and emits light toward the front side of the lighting system 1.

The number, size and the like of the light emitting elements 22 are not limited to the example shown in the figures, and may be appropriately changed according to the size, usage or the like of the lighting system 1.

The control element 23 is mounted on the wiring pattern 24.

The control element 23 controls an electric current flowing in the light emitting element 22. That is, the control element 23 controls light emission of the light emitting element 22.

The number, size and the like of the control elements 23 are not limited to the example shown in the figures, and may be appropriately changed according to the number, type or the like of the light emitting elements 22.

The wiring pattern 24 is provided on at least one surface of the board 21.

The wiring pattern 24 may be provided on both surfaces of the board 21, but is preferably provided on one surface of the board 21 in order to reduce the manufacturing cost.

The wiring pattern 24 is provided with an input terminal 24a.

Plural input terminals 24a are provided. The power supply terminal 31 of the power supply portion 30 is electrically connected to the input terminal 24a. Thus, the light emitting element 22 is electrically connected to the power supply portion 30 through the wiring pattern 24.

The wiring 25 electrically connects the electrode 29 provided on the upper surface of the light emitting element 22 and the wiring pad 24c provided in the wiring pattern 24.

The wiring 25 may be formed of a cable using gold as a main component, for example. Here, the material of the wiring 25 is not limited to a material using gold as a main component, and may be a material using copper as a main component or a material using aluminum as a main component.

The wiring 25 electrically connects the electrode 29 provided on the upper surface of the light emitting element 22 to the wiring pad 24c provided in the wiring pattern 24 by ultrasonic welding or hot welding. The wiring 25 may be electrically connected to the electrode 29 provided on the upper surface of the light emitting element 22 and the wiring pad 24c provided in the wiring pattern 24 using a wire bonding method, for example.

Further, a circuit component (not shown) or the like may be appropriately provided as necessary. The circuit component (not shown) may be mounted on the wiring pattern 24, for example.

The surrounding wall member 26 is provided on the board 21 to surround the plural light emitting elements 22. The surrounding wall member 26 has a ring shape, for example, so that the plural light emitting elements 22 are arranged in a central portion 26a thereof.

The surrounding wall member 26 may be formed of a resin such as polybutylene terephthalate (PBT) or polycarbonate (PC), ceramics, or the like.

Further, when the material of the surrounding wall member 26 is a resin, particles made of titanium oxide or the like may be mixed therein to improve reflectance to light emitted from the light emitting element 22.

The material of the particles is not limited to titanium oxide, and any material with high reflectance to the light emitted from the light emitting element 22 may be used for particles to be mixed.

Further, the surrounding wall member 26 may be formed of a white resin, for example.

A side wall surface 26b of the surrounding wall member 26 on a side of the central portion 26a is formed as an inclined surface. A part of the light emitted from the light emitting element 22 is reflected from the side wall surface 26b of the surrounding wall member 26, and is emitted toward the front side of the lighting system 1.

Further, light that is a part of the light emitted from the light emitting element 22 toward the front side of the lighting system 1 and is totally reflected on an upper surface (interface between the sealing portion 27 and the outside air) of the sealing portion 27 is reflected from the side wall surface 26b of the surrounding wall member 26 on the side of the central portion 26a, and is emitted again toward the front side of the lighting system 1.

That is, the surrounding wall member 26 may have a reflector function. The configuration of the surrounding wall member 26 is not limited to the example shown in the figures, and may be appropriately changed.

The sealing portion 27 is provided in the central portion 26a of the surrounding wall member 26. The sealing portion 27 is provided to cover the inside of the surrounding wall member 26. That is, the sealing portion 27 is provided inside the surrounding wall member 26 to cover the light emitting elements 22 and the wirings 25.

The sealing portion 27 is formed of a light transmitting material. The sealing portion 27 may be formed of a silicone resin, for example.

The sealing portion 27 may be formed by filling the central portion 26a of the surrounding wall member 26 with a resin, for example. The filling of the resin may be performed using a liquid quantitative discharge apparatus such as a dispenser.

If the central portion 26a of the surrounding wall member 26 is filled with the resin, it is possible to suppress mechanical contact from the outside with respect to the light emitting elements 22, the wiring pattern 24 arranged in the central portion 26a of the surrounding wall member 26, the wirings 25, or the like. Further, it is possible to suppress air, moisture or the like from being attached to the light emitting elements 22, the wiring pattern 24 arranged in the central portion 26a of the surrounding wall member 26, the wirings 25, or the like. Thus, it is possible to enhance the reliability of the lighting system 1.

Further, the sealing portion 27 may include a fluorescent substance. The fluorescent substance may be embodied as a YAG type fluorescent substance (yttrium aluminum garnet type fluorescent substance), for example.

For example, when the light emitting element 22 is a blue light emitting diode and the fluorescent substance is the YAG type fluorescent substance, the YAG type fluorescent substance is excited by blue light emitted from the light emitting element 22, and yellow fluorescence is emitted from the YAG type fluorescent substance. Further, as the blue light is mixed with the yellow light, white light is emitted from the lighting system 1. The type of the fluorescent substance or the type of the light emitting element 22 is not limited to an example described above, and may be appropriately changed so that a desired light emitting color is obtained according to the usage or the like of the lighting system 1.

The bonding portion 28 bonds the surrounding wall member 26 with the board 21.

The bonding portion 28 has a film shape, and is provided between the surrounding wall member 26 and the board 21.

The bonding portion 28 may be formed by curing a silicone based adhesive or an epoxy based adhesive, for example.

The bonding portion 28 may be formed through the following procedure, for example.

First, a silicon based adhesive or an epoxy based adhesive is coated in a region on the surface of the board 21 where the surrounding wall member 26 is provided.

For example, the adhesive is coated in the region on the surface of the board 21 where the surrounding wall member 26 is provided using a dispenser or the like.

Then, the adhesive is cured by evaporating a solvent or the like to form the bonding portion 28, and to bond the surrounding wall member 26 with the board 21.

For example, first, the surrounding wall member 26 is placed on the coated adhesive.

Subsequently, the surrounding wall member 26 is pressed to bring the adhesive into close contact with the surrounding wall member 26, and the position (thickness of the adhesive) of the surrounding wall member 26 is adjusted.

Then, the adhesive is cured by evaporating the solvent or the like.

Here, it is preferable that the viscosity of the adhesive before curing is 1 Pa·s to 15 Pa·s. With such a viscosity, when performing the coating using the dispenser or the like, it is possible to easily perform the coating into an arbitrary shape.

Further, with such a viscosity, when curing the adhesive, it is possible to stabilize the position of the surrounding wall member 26.

The plural power supply terminals 31 are provided in the power supply portion 30.

The plural power supply terminals 31 extend inside the accommodating portion 11 and the flange 12.

One end portion of each of the plural power supply terminals 31 protrudes from a bottom surface of the accommodating portion 11, and is electrically connected to the input terminal 24a of the wiring pattern 24. The other end portion of each of the plural power supply terminals 31 is exposed from a side opposite to a side of the main body portion 10 where the board 21 is provided.

The number, arrangement, type or the like of the power supply terminals 31 is not limited thereto, and may be appropriately changed.

Further, the power supply portion 30 may be provided with a board (not shown), or a circuit component (not shown) such as a capacitor or a resistor. The board or the circuit component (not shown) may be provided inside the accommodating portion 11 or the flange 12, for example.

The socket 40 is fitted to the end portion of each of the plural power supply terminals 31, which is exposed to the side opposite to the side of the main body portion 10 where the board 21 is provided.

The socket 40 is electrically connected to a power source (not shown) or the like.

Thus, by fitting the socket 40 to the end portion of the power supply terminal 31, the power source (not shown) or the like and the light emitting element 22 are electrically connected to each other.

The socket 40 may be bonded to an element on the side of the main body portion 10 using an adhesive or the like.

Here, thermal deformation (expansion and contraction) occurs in the sealing portion 27 by turning on and turning off the light emitting element 22.

Figure 5A:
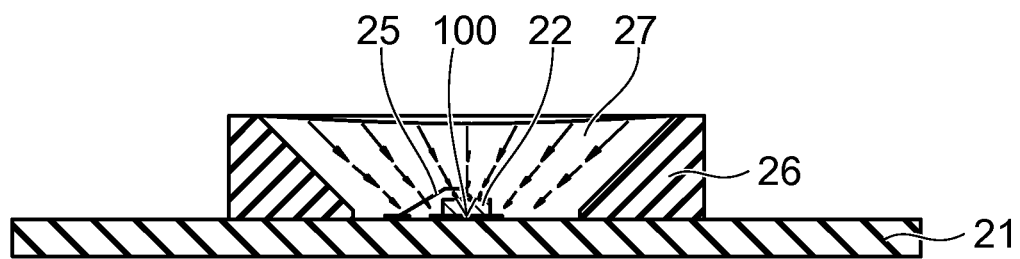
FIGS. 5(a) and 5(b) are schematic sectional views illustrating an influence due to thermal deformation of a sealing portion 27.
Figure 5B:
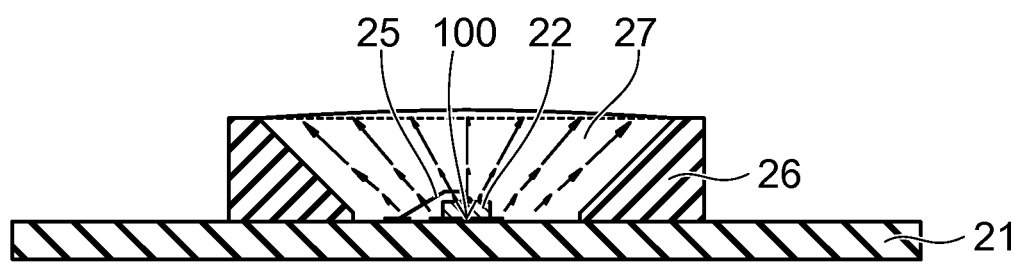

FIGS. 5(a) and 5(b) are schematic sectional views for illustrating an influence due to thermal deformation of the sealing portion 27.

FIG. 5(a) is a schematic sectional view illustrating thermal deformation of the sealing portion 27 when temperatures of the board 21, the wiring 25, the surrounding wall member 26, and the sealing portion 27 are low.

FIG. 5(b) is a schematic sectional view illustrating thermal deformation of the sealing portion 27 when temperatures of the board 21, the wiring 25, the surrounding wall member 26, and the sealing portion 27 are high.

Further, directions of arrows in FIGS. 5(a) and 5(b) indicate deformation directions of the sealing portion 27.

Lengths of the arrows in FIGS. 5(a) and 5(b) indicate sizes of stresses generated in the sealing portion 27 or amounts of deformation of the sealing portion 27. For example, when the length of the arrow is long, it is indicated that the amount of stress generated in the sealing portion 27 is large, or the amount of deformation of the sealing portion 27 is large.

For example, if the board 21 is formed using ceramics, the linear expansion coefficient of the board 21 becomes approximately 7 ppm/K. If the wiring 25 is formed using gold, the linear expansion coefficient of the wiring 25 becomes approximately 14 ppm/K. If the surrounding wall member 26 is formed using PBT, the linear expansion coefficient of the surrounding wall member 26 becomes approximately 90 ppm/K. If the surrounding wall member 26 is formed using PC, the linear expansion coefficient of the surrounding wall member 26 becomes approximately 65 ppm/K. If the sealing portion 27 is formed using a silicone resin, the linear expansion coefficient of the sealing portion 27 becomes approximately 200 ppm/K.

Thus, the amount of expansion and amount of contraction due to temperature change is the largest in the sealing portion 27. For example, the amount of expansion and amount of contraction of the sealing portion 27 is approximately 29 times the amount of expansion and amount of contraction of the board 21.

When the temperature is low, as shown in FIG. 5(a), the sealing portion 27 contracts toward the board 21, and the sealing portion 27 deforms in a direction in which an upper surface thereof is sunken. Further, as a distance from a central position 100 of a portion of the board 21 (inside portion of the surrounding wall member 26) surrounded by the surrounding wall member 26 in a peripheral direction of the sealing portion 27 becomes long, the stress and the amount of deformation generated in the sealing portion 27 become large. Further, as a distance from the surface of the board 21 in an upper surface direction of the sealing portion 27 becomes long, the stress and the amount of deformation generated in the sealing portion 27 become large.

When the temperature is high, as shown in FIG. 5(b), the sealing portion 27 relatively expands toward a side opposite to a side where the board 21 is present, and the sealing portion 27 deforms in a direction in which the upper surface thereof protrudes. Further, as the distance from the central position 100 of the portion of the board 21 surrounded by the surrounding wall member 26 in the peripheral direction of the sealing portion 27 becomes long, the stress and the amount of deformation generated in the sealing portion 27 become large. Further, as the distance from the surface of the board 21 in the upper surface direction of the sealing portion 27 becomes large, the stress and the amount of deformation generated in the sealing portion 27 become large.

In this case, the wiring 25 is present in the sealing portion 27. Thus, if thermal deformation occurs in the sealing portion 27, an external force acts on the wiring 25.

Further, when the plural light emitting elements 22 are used to create a high intensity of light, since the size and volume of the sealing portion 27 increase, the influence due to thermal deformation further increases. In addition, when the lighting system 1 is used in a vehicle, a large change in an ambient temperature (for example, a range of −40° C. to +85° C.) is added thereto, and thus, the influence due to thermal deformation further increases.

Figure 6:
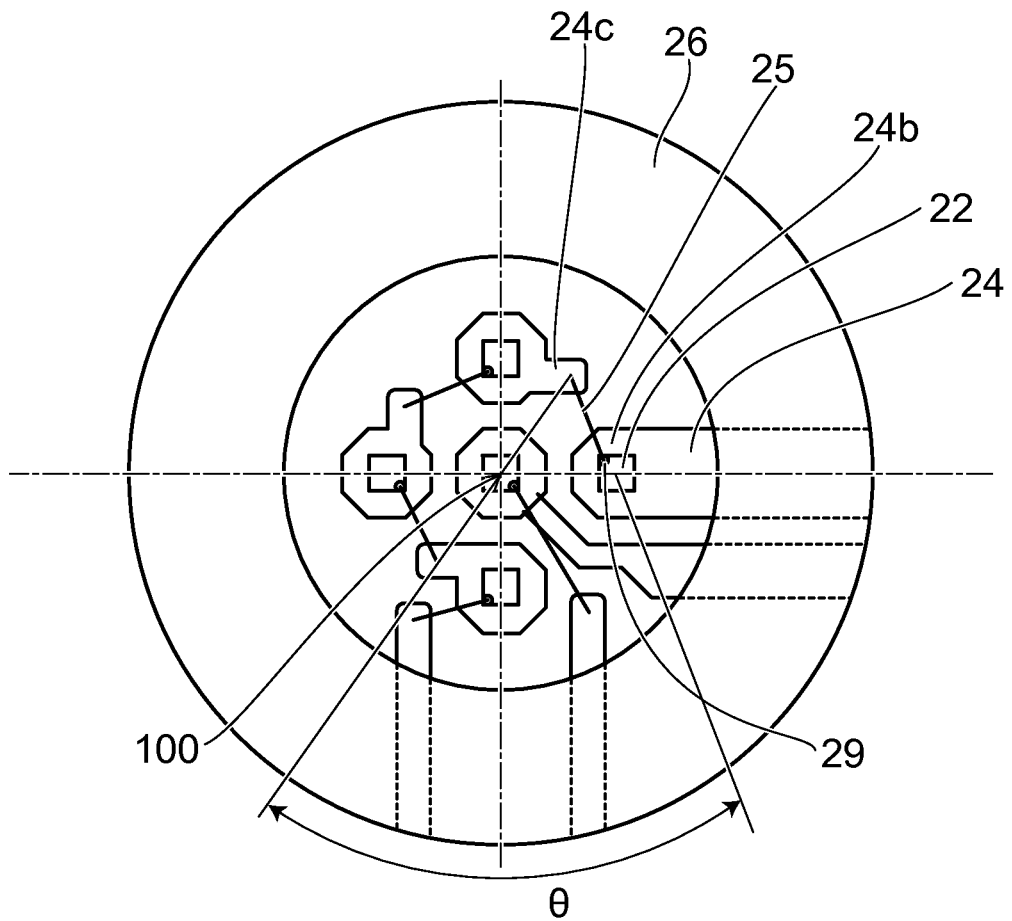
FIG. 6 is a schematic plan view illustrating an arrangement of a wiring 25 according to a comparative example.

FIG. 6 is a schematic plan view illustrating an arrangement of wirings 25 according to a comparative example.

Figure 7:
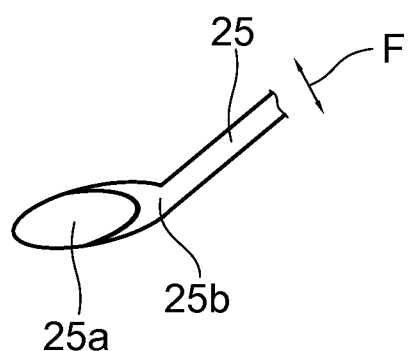
FIG. 7 is a schematic perspective view illustrating an end portion of the wiring 25 connected to a wiring pad 24c.

FIG. 7 is a schematic perspective view illustrating an end portion of the wiring 25 connected to the wiring pad 24c.

As described above, an external force acts on the wiring 25 due to thermal deformation generated in the sealing portion 27. Further, as shown in FIGS. 5(a) and 5(b), a deformation direction of the sealing member 27 in a planar surface direction approximately becomes a radius vector direction from the central position 100 of the portion of the board 21 surrounded by the surrounding wall member 26.

Thus, an external force formed by a component force in the radius vector direction and a component force in the vertical direction acts on the wiring 25.

Here, as shown in FIG. 6, an angle (hereinafter, referred to as an installation angle of the wiring 25) formed by a segment that connects the central position 100 and a position where the wiring 25 is connected to the wiring pad 24c (for example, second bonding position), and an axis line of the wiring 25 (segment in a direction in which the wiring 25 extends) is represented as θ.

In this case, a direction in which the segment that connects the central position 100 and the position where the wiring 25 is connected to the wiring pad 24c extends becomes a direction in which the component force in the radius vector direction acts.

Thus, as the installation angle θ of the wiring 25 comes close to 90 degrees, a force that acts in a direction orthogonal to the axis line of the wiring 25 becomes large. That is, as the installation angle θ of the wiring 25 comes close to 90 degrees, a lateral load to the wiring 25 becomes large.

Further, as shown in FIG. 7, an end portion of the wiring 25 on the side of the wiring pad 24c collapses as a load and ultrasound are applied thereto. Thus, the structure of a portion (neck portion) 25b between the collapsed portion 25a and a non-collapsed portion becomes weak.

Thus, if a lateral load F is excessively large, disconnection may occur in the neck portion 25b.

In this case, as described later, by setting the installation angle θ of the wiring 25 in a predetermined range, it is possible to suppress the lateral load F, to thereby suppress disconnection of the wiring 25.

FIG. 8 is a schematic diagram illustrating the installation angle θ of the wiring 25.

As shown in FIG. 8, the installation angle θ of the wiring 25 is 0° to 180°.

In this case, as the installation angle θ of the wiring 25 comes close to 90°, since the lateral load for the wiring 25 increases, disconnection easily occurs.

Table 1 shows the relationship between the installation angle θ of the wiring 25 and disconnection.

Table 1 is obtained by calculating the relationship between the installation angle θ of the wiring 25 and the disconnection through a thermal shock test.

In the thermal shock test, the light emitting portion 20 is left for 30 minutes at a temperature of −40° C., and then, the light emitting portion 20 is left for 30 minutes at a temperature of +85° C. and the light emitting element 22 is turned on. This procedure is repeated 500 times.

10 samples having different installation angles θ of the wiring 25 are prepared, and then, the presence or absence of disconnection is determined and resistance to temperature change is determined based on the number of samples in which disconnection occurs.

In the determination, a case where the disconnection of the wiring 25 does not occur is represented as "O", a case where the number of samples in which the disconnection occurs is 1 to 5 among the 10 is represented as "Δ", and a case where the number of samples in which the disconnection occurs is 6 to 10 among the 10 is represented as "X".

TABLE 1

| θ | DETERMINATION | NUMBER OF DISCONNECTION/ DENOMINATOR |
|---|---|---|
| 0° | O | 0/10 |
| 10° | O | 0/10 |
| 20° | O | 0/10 |
| 35° | O | 0/10 |
| 45° | O | 0/10 |
| 55° | Δ | 3/10 |
| 70° | Δ | 5/10 |
| 80° | X | 8/10 |
| 90° | X | 10/10 |
| 100° | X | 9/10 |
| 110° | X | 6/10 |
| 125° | Δ | 4/10 |
| 135° | O | 0/10 |
| 145° | O | 0/10 |
| 160° | O | 0/10 |
| 170° | O | 0/10 |
| 180° | O | 0/10 |

As understood from Table 1, by setting the installation angle θ of the wiring 25 to 0° to 45°, or 135° to 180°, it is possible to significantly lower a disconnection occurrence probability.

Further, as described above, as the distance from the surface of the board 21 in the upper surface direction of the sealing portion 27 becomes long, the stress and the amount of deformation generated in the sealing portion 27 become large.

Thus, the component force acting on the wiring 25 in the vertical direction increases closer to the upper surface of the sealing portion 27.

Further, if the component force in the vertical direction significantly increases, disconnection may occur in the vicinity of a bonding portion between the wiring 25 and the electrode 29.

Figure 9:
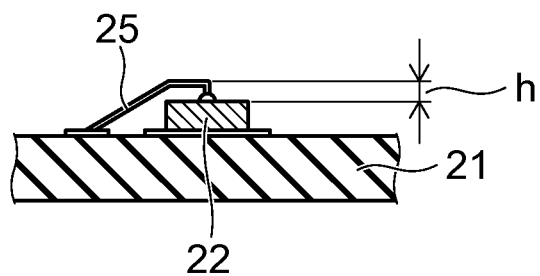
FIG. 9 is a schematic view illustrating a loop height h of the wiring 25.

FIG. 9 is a schematic view illustrating a loop height h of the wiring 25.

As shown in FIG. 9, the loop height h of the wiring 25 represents a height from the upper surface of the light emitting element 22 to an upper end of a loop of the wiring 25.

According to observation of the present inventors, by setting the loop height h of the wiring 25 to be equal to or lower than 160 μm, it is possible to significantly lower a disconnection occurrence probability in the vicinity of the bonding portion between the wiring 25 and the electrode 29.

Further, if the linear expansion coefficient of the surrounding wall member 26 is equal to or greater than the linear expansion coefficient of the sealing portion 27, thermal deformation of the sealing portion 27 is accelerated, and thus, disconnection of the wiring 25 easily occurs.

In this case, by setting the linear expansion coefficient of the surrounding wall member 26 to be equal to or greater than the linear expansion coefficient of the board 21 and to be equal to or lower than the linear expansion coefficient of the sealing portion 27, it is possible to suppress thermal deformation of the sealing portion 27.

For example, when the board 21 is formed using ceramics (approximately 7 ppm/K) and the sealing portion 27 is formed using a silicone resin, it is possible to form the surrounding wall member 26 using PBT (approximately 90 ppm/K) or PC (approximately 65 ppm/K).

Hereinbefore, the exemplary embodiments of the invention have been described, but the embodiments are only examples, and do not define the scope of the invention.

These new embodiments may be realized in other various forms, and various omissions, substitutions, modifications or the like may be made in a range without departing from the spirit of the invention. These embodiments and modified examples thereof are included in the scope or spirit of the invention, and are included in the invention disclosed in claims and the equivalents thereof. Further, the above-described embodiments may be combined with each other for the sake of realization.

REFERENCE SIGNS LIST

1 LIGHTING SYSTEM
10 MAIN BODY PORTION
11 ACCOMMODATING PORTION
12 FLANGE
20 LIGHT EMITTING PORTION
21 SUBSTRATE
22 LIGHT EMITTING ELEMENT
23 CONTROL ELEMENT
24 WIRING PATTERN
24a INPUT TERMINAL
24c WIRING PAD
25 WIRING
26 SURROUNDING WALL MEMBER
27 SEALING PORTION
29 ELECTRODE
30 POWER SUPPLY
31 POWER SUPPLY TERMINAL
40 SOCKET
100 CENTRAL POSITION
H LOOP HEIGHT

The invention claimed is:

1. A lighting system comprising:
a board;
a wiring pattern that is provided on a surface of the board and has a wiring pad;
a light emitting element that is provided on the wiring pattern and includes an electrode on a surface thereof opposite to a surface thereof provided on the wiring pattern;
a surrounding wall member that is provided to surround the light emitting element;
a wiring that connects the wiring pad and the electrode; and
a sealing portion that is provided inside the surrounding wall member and covers the light emitting element and the wiring,
wherein an angle that is formed by a segment that connects a central position of a portion of the board surrounded by the surrounding wall member and a position where the wiring is connected to the wiring pad, and the wiring is 0° to 45°, or 135° to 180°, and
wherein a linear expansion coefficient of the surrounding wall member is equal to or less than a linear expansion coefficient of the sealing portion, and is equal to or greater than a linear expansion coefficient of the board.

2. The system according to claim 1, wherein a height from an upper surface of the light emitting element to an upper end of a loop of the wiring is equal to or less than 160 μm.

3. The system according to claim 1, further comprising:
a power supply terminal that is electrically connected to the wiring pattern; and
a socket that is fitted to the power supply terminal.

4. The system according to claim 1, wherein the board is formed of ceramics.

5. The system according to claim 1, further comprising a main body portion, wherein the board is provided inside the main body portion.

6. The system according to claim 5, wherein the main body portion is formed of a resin with a high thermal conductivity.

7. The system according to claim 5, wherein the main body portion has a fin.

8. The system according to claim 1, wherein the linear expansion coefficient of the surrounding wall member is less than the linear expansion coefficient of the sealing portion and greater than the linear expansion coefficient of the board.

* * * * *